United States Patent
Tsutsui et al.

(10) Patent No.: US 8,383,486 B2
(45) Date of Patent: Feb. 26, 2013

(54) METHOD OF MANUFACTURING A SEMICONDUCTOR DEVICE INCLUDING A STRESS FILM

(75) Inventors: Masafumi Tsutsui, Osaka (JP); Hiroyuki Umimoto, Hyogo (JP); Kaori Akamatsu, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/486,877

(22) Filed: Jun. 1, 2012

(65) Prior Publication Data

US 2012/0238068 A1     Sep. 20, 2012

Related U.S. Application Data

(60) Division of application No. 12/985,636, filed on Jan. 6, 2011, now Pat. No. 8,203,186, which is a division of application No. 12/170,191, filed on Jul. 9, 2008, now Pat. No. 7,893,501, which is a continuation of application No. 11/730,988, filed on Apr. 5, 2007, now Pat. No. 7,417,289, which is a continuation of application No. 10/859,219, filed on Jun. 3, 2004, now Pat. No. 7,205,615.

(30) Foreign Application Priority Data

Jun. 16, 2003   (JP) .................... 2003-170335

(51) Int. Cl.
    *H01L 21/336* (2006.01)
(52) U.S. Cl. .................... 438/303; 257/E21.409
(58) Field of Classification Search .......... 257/E21.409; 438/303
    See application file for complete search history.

(56) References Cited

U.S. PATENT DOCUMENTS

| | | | |
|---|---|---|---|
| 5,023,676 A | 6/1991 | Tatsuta | |
| 6,437,404 B1 | 8/2002 | Xiang et al. | |
| 6,573,172 B1 | 6/2003 | En et al. | |
| 6,870,230 B2 | 3/2005 | Matsuda et al. | |
| 6,977,194 B2 | 12/2005 | Belyansky et al. | |
| 6,982,465 B2 | 1/2006 | Kumagai et al. | |
| 7,022,561 B2 | 4/2006 | Huang et al. | |
| 7,115,954 B2 | 10/2006 | Shimizu et al. | |
| 7,205,615 B2 | 4/2007 | Tsutsui | |
| 7,417,289 B2 | 8/2008 | Tsutsui et al. | |
| 2003/0040158 A1 | 2/2003 | Saitoh | |
| 2004/0075148 A1 | 4/2004 | Kumagai et al. | |
| 2005/0194596 A1 | 9/2005 | Chan et al. | |
| 2005/0269650 A1 | 12/2005 | Pidin | |

FOREIGN PATENT DOCUMENTS

| | | |
|---|---|---|
| JP | 52-120776 | 10/1977 |
| JP | 60-236209 | 11/1985 |
| JP | 01-042840 A | 2/1989 |
| JP | 2003-086708 | 3/2003 |
| JP | 2004-193166 | 7/2004 |
| WO | WO 0243151 A1 | 5/2002 |

OTHER PUBLICATIONS

Shimizu, A., et al., "Local Mechanical-Stress Comtrol (LMC): A New Technique for CMOS_Performance Enhancement", 2001, IEDM 01, p. 19.4.1-19.4.4.

Japanese Office Action, with English translation, issued in Japanese Patent Application No. 2003-170335, mailed Dec. 22, 2009.

(Continued)

*Primary Examiner* — Howard Weiss
(74) *Attorney, Agent, or Firm* — McDermott Will & Emery LLP

(57) ABSTRACT

A semiconductor device includes a first-type internal stress film formed of a silicon oxide film over source/drain regions of an nMISFET and a second-type internal stress film formed of a TEOS film over source/drain regions of a pMISFET. In a channel region of the nMISFET, a tensile stress is generated in the direction of movement of electrons due to the first-type internal stress film, so that the mobility of electrons is increased. In a channel region of the pMISFET, a compressive stress is generated in the direction of movement of holes due to the second-type internal stress film, so that the mobility of holes is increased.

2 Claims, 9 Drawing Sheets

OTHER PUBLICATIONS

Japanese Office Action, with English translation, issued in Japanese Patent Application No. 2003-170335, mailed Mar. 23, 2010.
Notice of Allowance issued in U.S. Appl. No. 10/859,219, mailed Feb. 5, 2007.
Notice of Allowance issued in U.S. Appl. No. 11/730,988, mailed May 5, 2008.
Notice of Allowance issued in U.S. Appl. No. 12/170,191, mailed Oct. 15, 2010.
Notice of Allowance issued in U.S. Appl. No. 12/985,636, mailed Mar. 26, 2012.

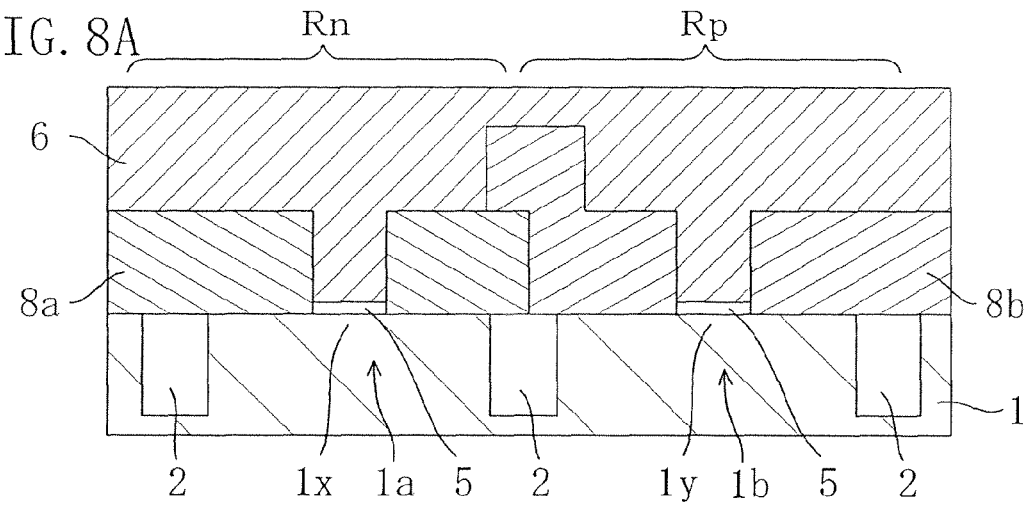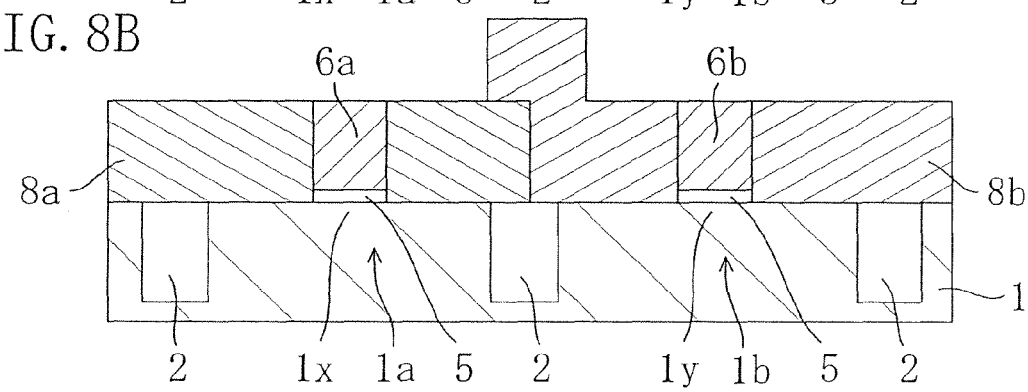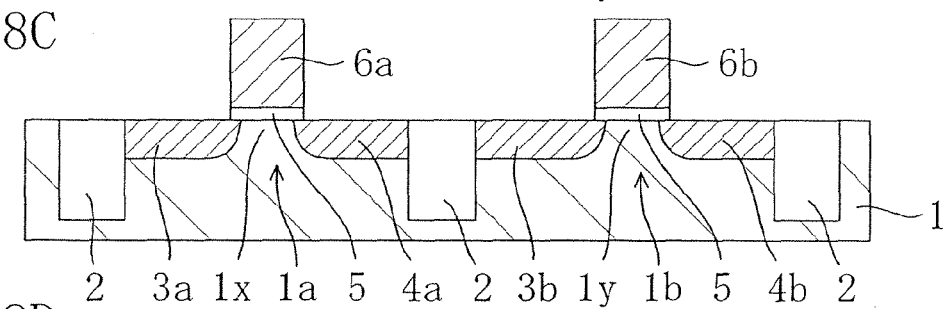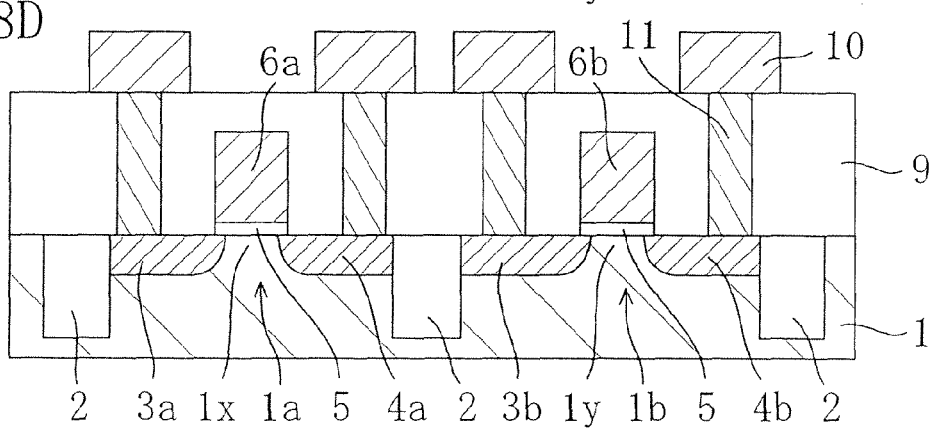

METHOD OF MANUFACTURING A SEMICONDUCTOR DEVICE INCLUDING A STRESS FILM

RELATED APPLICATIONS

This application is a Divisional of U.S. application No. 12/985,636, filed on Jan. 6, 2011 now U.S. Pat. No. 8,203,186, which is a Divisional of U.S. patent application Ser. No. 12/170,191, filed on Jul. 9, 2008, now U.S. Pat. No. 7,893,501, which is a Continuation of U.S. patent application Ser. No. 11/730,988, filed on Apr. 5, 2007, now U.S. Pat. No. 7,417,289, which is a Continuation of U.S. patent application Ser. No. 10/859,219, filed on Jun. 3, 2004, now U.S. Pat. No. 7,205,615, claiming priority of Japanese Patent Application No. 2003-170335, filed on Jun. 16, 2003, the entire contents of each of which are hereby incorporated by reference.

BACKGROUND OF THE INVENTION

The present invention relates to a semiconductor device including an MISFET and a method for fabricating the same, and more particularly relates to a measure for increasing the mobility of carriers.

When a stress is generated in a semiconductor crystal layer, a crystal-lattice constant varies and a band structure is changed, so that the mobility of carriers is changed. This phenomenon has been known as the "piezo resistivity effect". Whether the carrier mobility is increased or reduced differs depending on the plane direction of a substrate, the direction in which carriers move, and whether the stress is a tensile stress or a compressive stress. For example, in an Si (100) substrate, i.e., a silicon substrate of which the principal surface is the {100} plane, assume that carriers move in the [011] direction. When carriers are electrons, with a tensile stress generated in the direction in which electrons in a channel region move, the mobility of the carriers is increased. On the other hand, when carriers are holes, with a compressive stress generated in the direction in which holes in a channel region move, the mobility of the carriers is increased. The increase rate of carrier mobility is proportional to the size of a stress.

In this connection, conventionally, there have been proposals for increasing carrier mobility by applying a stress to a semiconductor crystal layer to increase the operation speed of transistors and the like. For example, in Reference 1, an entire semiconductor substrate is bent using an external device, thereby generating a stress in an active region of a transistor.

SUMMARY OF THE INVENTION

However, in the above-described known structure, an external device is needed in addition to a semiconductor substrate and a stress can be generated only in the same direction in an entire region of the semiconductor substrate in which active regions of a transistor and the like are provided and which is located in the principal surface side. For example, when an Si (100) substrate is used, neither the mobility of electrons nor the mobility of holes can be increased.

It is therefore an object of the present invention to provide, by generating a stress which increases the mobility of carriers in a semiconductor layer without using an external device, a semiconductor device including a pMISFET and an nMISFET of which respective operation speeds are increased and a method for fabricating the same.

A semiconductor device according to the present invention includes an internal stress film for generating a stress in a gate length direction in a channel region of an active region in which a MISFET is formed.

Thus, the mobility of carriers in the MISFET can be increased by using the piezo resistivity effect.

The internal stress film is capable of covering one or both of source/drain regions. In an nMISFET, the internal stress film generates a tensile stress substantially in the parallel direction to a gate length direction in a channel region (i.e., the direction of movement of electrons). In a pMISFET, the internal stress film generates a compressive stress substantially in the parallel direction to a gate length direction in a channel region (i.e., the direction of movement of holes).

Covering both side surfaces or both side and upper surfaces of a gate electrode, the internal stress film can generate a stress in the longitudinal direction of the channel region through the gate electrode, thereby increasing the mobility of carriers.

Moreover, covering a side surface of the gate electrode and an upper surface of the semiconductor substrate in two regions of the substrate sandwiching part of the gate electrode, whether the MISFET is an nMISFET or a pMISFET, the internal stress film can generate a tensile stress substantially in the parallel direction to the gate width direction of the MISFET, thereby increasing the mobility of carriers.

A first method for fabricating a semiconductor device according to the present invention is a method in which an nMISFET and a pMISFET are formed in first and second active regions of a semiconductor substrate, respectively, and then first and second internal stress films which cover source/drain regions of the nMISFET and source/drain regions of the pMISFET, respectively, and generate a tensile stress and a compressive stress, respectively, substantially in the parallel directions to respective gate length directions of the channel regions are formed.

According to this method, a CMOS device of which the operation speed is increased can be obtained.

A second method for fabricating a semiconductor device according to the present invention is a method in which an internal stress film is formed first, a groove is formed in the internal stress film, a gate insulating film and a buried gate electrode are formed in the groove, and then the internal stress film is removed.

According to this method, a stress which increases the mobility of carriers in the channel region can be generated using a remaining stress in the gate insulating film.

BRIEF DESCRIPTION OF THE DRAWINGS

FIGS. 8A through 8D are cross-sectional views illustrating latter half of respective steps for fabricating the semiconductor device of the second embodiment.

DESCRIPTION OF THE PREFERRED EMBODIMENTS (First Embodiment)

Figure 1:
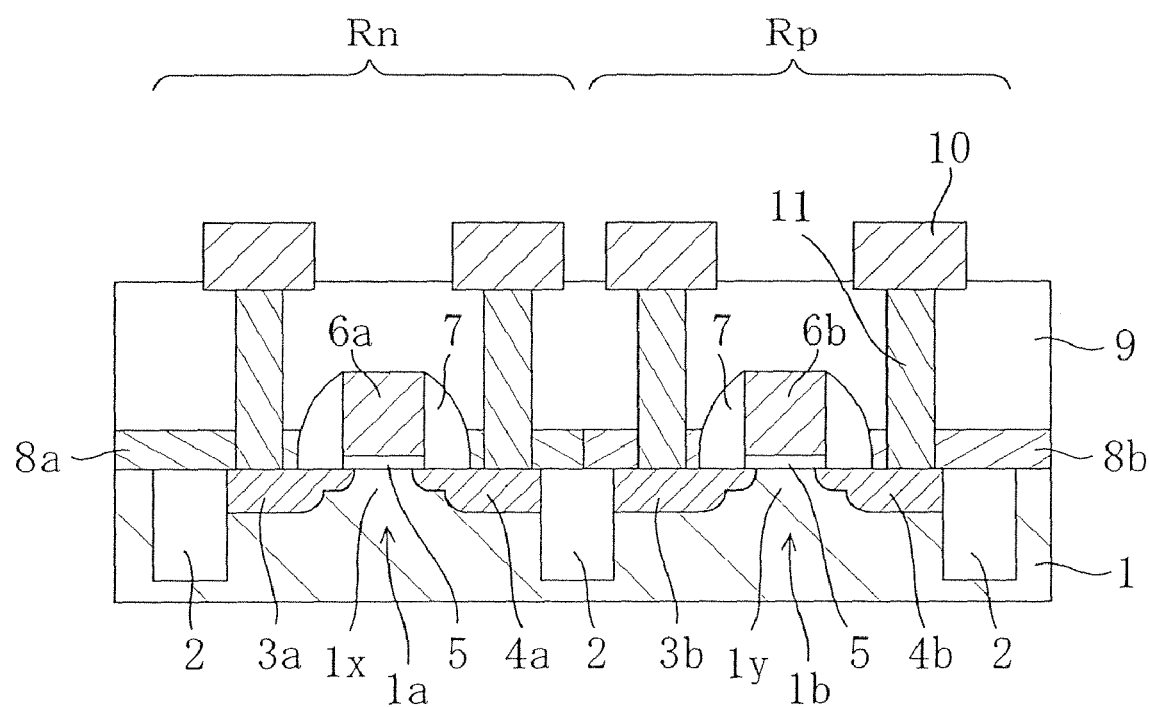
FIG. 1 is a cross-sectional view illustrating a semiconductor device according to a first embodiment of the present invention.

FIG. 1 is a cross-sectional view illustrating a semiconductor device according to a first embodiment of the present invention. As shown in FIG. 1, a surface region of a semiconductor substrate 1, i.e., an Si (100) substrate is divided into a plurality of active regions 1a and 1b by an isolation region 2. The semiconductor device includes an nMISFET formation region Rn which includes the active region 1a and in which an nMISFET is to be formed and a pMISFET formation region Rp which includes the active region 1b and in which a pMISFET is to be formed.

The nMISFET includes n-type source/drain regions 3a and 4a each of which includes an n-type lightly doped impurity region, an n-type heavily doped impurity region and a silicide layer such as a $CoSi_2$ layer, a gate insulating film 5 formed on the active region 1a and made of a silicon oxide film, a silicon oxynitride film or the like, a gate electrode 6a formed on the gate insulating film 5 and made of polysilicon, aluminum or the like, and a sidewall 7 covering a side surface of the gate electrode 6a and made of an insulating film. Part of the active region 1a located under the gate electrode 6a is a channel region 1x in which electrons move (travel) when the nMISFET is in an operation state.

The pMISFET includes p-type source/drain regions 3b and 4b each of which includes a p-type lightly doped impurity region, a p-type heavily doped impurity region and a silicide layer such as a $CoSi_2$ layer, a gate insulating film 5 formed on the active region 1b and made of a silicon oxide film, a silicon oxynitride film or the like, a gate electrode 6b formed on the gate insulating film 5 and made of polysilicon, aluminum or the like, and a sidewall 7 covering a side surface of the gate electrode 6b and made of an insulating film. Part of the active region 1b located under the gate electrode 6b is a channel region 1y in which holes move (travel) when the pMISFET is in an operation state.

Moreover, provided are a first-type internal stress film 8a formed on the source/drain regions 3a and 4a of the nMISFET, made of a silicon nitride film or the like, and having a thickness of about 20 nm, a second-type internal stress film 8b formed on the source/drain regions 3b and 4b of the pMISFET, made of a TEOS film or the like, and having a thickness of about 20 nm, an interlevel insulating film 9 covering the nMISFET and pMISFET and having a surface flattened, a lead electrode 10 formed on the interlevel insulating film 9, and a contact 11 connecting each of the source/drain regions 3a, 3b, 4a and 4b with the lead electrode 10 through the interlevel insulating film 9.

Herein, an "internal stress film" is a film characterized in that where the internal stress film is directly in contact with some other member or faces some other member with a thin film interposed therebetween, a stress is generated in the film itself. As for stress, there are tensile stress and compressive stress. In this embodiment and other embodiments, an internal stress film in which a tensile stress is generated substantially in the parallel direction to the direction in which carriers move (i.e., the gate length direction) in a channel region of an MISFET is referred to as a "first-type internal stress film" and an internal stress film in which a compressive stress is generated substantially in the parallel direction to the direction in which carriers move (the gate length direction) in a channel region of an MISFET is referred to as a "second-type internal stress film".

Herein, the semiconductor substrate 1 is an Si substrate of which the principal surface is the {100} plane and is referred to as an Si (100) substrate for convenience. However, the {100} plane is a general name for the (±100) plane, the (0±10) plane and the (00±1) plane, and therefore, even a plane which is not exactly the {100} plane and is tilted from the {100} plane by a less angle than 10 degree is considered to be substantially the {100} plane. Moreover, in this embodiment, the direction in which electrons move in the nMISFET and the direction in which holes move in the pMISFET (i.e., the gate length direction of each MISFET) is the [011] direction. However, in this embodiment, the "[011] direction on the principal surface of an Si (100) substrate" includes equivalent directions to the [011] direction, such as the [01-1] direction, the [0-11] direction, and the [0-1-1] direction, i.e., directions within the range of the <011> direction. That is, even a direction which is not exactly the [011] direction and tilted from the <011> direction by a less angle than 10 degree is considered to be substantially the [011] direction.

According to this embodiment, the following effects can be obtained.

In the nMISFET, when the first-type internal stress film 8a is brought into a direct contact with a semiconductor layer or made to face a semiconductor layer with a thin film interposed therebetween, a stress for compressing the first-type internal stress film itself, i.e., a compressive stress is generated in the first-type internal stress film 8a. As a result, by the first-type internal stress film 8a, the semiconductor layer adjacent to the first-type internal stress film 8a can be stretched in the vertical direction to a boundary surface.

Specifically, the first-type internal stress film 8a applies a compressive stress to the source region 3a and the drain region 4a in the active region 1a of the nMISFET in the parallel direction to the principal surface. As a result, a tensile stress is applied to a region of the substrate located between the source region 3a and the drain region 4a, i.e., the channel region 1x in the gate length direction (the direction in which electrons move when the nMISFET is in an operation state). Then, with this tensile stress, electrons are influenced by the piezo resistivity effect, so that the mobility of electrons is increased. Herein, "substantially in the parallel direction" also means in a direction tilted by an angle of less than 10 degree from the direction in which electrons move.

For example, assume that the substrate 1 is an Si (100) substrate and the direction in which electrons move is the [011] direction. When the internal stress of the first-type internal stress film 8a adjacent to the semiconductor layer is a general level for a silicon nitride film, i.e., 1.5 GPa, the thickness of the first-type internal stress film 8a is 20 nm, a space between respective parts of the source and drain regions 3a and 4a being in contact with the first-type internal stress film 8a, i.e., the length of the channel region 1x, is 0.2 µm, a tensile stress in the gate length direction generated at a depth of 10 nm from the surface of the substrate is 0.3 GPa (J. Appl. Phys., vol. 38-7, p. 2913, 1967) and the improvement rate of the mobility of electrons is +10% (Phys. Rev,. vol. 94, p. 42, 1954). To obtain a larger change in the mobility than this, the tensile stress of a semiconductor can be increased. Thus, a film having a large internal stress can be used as the first-type internal stress film 8a, the thickness of the first-type internal stress film 8a can be increased, or the space between the parts of the source and drain regions 3a and 4a being in contact with the first-type internal stress film 8a, i.e. the length of the channel region 1x, can be reduced for a larger change in the mobility. For example, when the thickness of the first-type internal stress film 8a is doubled, the space between the parts of the source and drain regions 3a and 4a being in contact with the first-type internal stress film 8a, i.e., the length of the channel region 1x is reduced to half, the improvement rate of the mobility of electrons is +40%. As another way to obtain a large mobility, the direction in which electrons move is changed from the [011] direction to the [010] direction to change the improvement rate of the mobility of electrons with respect to a tensile stress. As a result, with the same tensile stress, the improvement rate of the mobility becomes about 3.5 times large. Although the source and drain regions 3a and 4a receive compressive stresses by the first-type internal stress film 8a, influence of the piezo resistivity effect is small because a low-resistant heavily doped semiconductor device and a silicide film are used. Moreover, influence of the internal stress of the interlevel insulating film 9 on the channel region can be neglected. This is because with the substrate covered by the interlevel insulating film 9, internal stresses in the interlevel insulating film 9 are cancelled off with each other, so that the function of applying stress to the active regions 1a and 1b is small.

In the pMISFET, when the second-type internal stress film 8b is brought into a direct contact with the semiconductor layer or made to face a semiconductor layer with a thin film interposed therebetween, a stress for stretching the second-type internal stress film itself, i.e., a tensile stress is generated in the second-type internal stress film 8b. As a result, by the second-type internal stress film 8b, the semiconductor layer adjacent to the second-type internal stress film 8b is compressed in the vertical direction to a boundary surface. Specifically, the second-type internal stress film 8b applies a tensile stress to the source region 3b and the drain region 4b in the active region 1b of the pMISFET in the parallel direction to the principal surface. As a result, a compressive stress is applied to a region of the substrate located between the source region 3b and the drain region 4b, i.e., the channel region 1y substantially in the parallel direction to the gate length direction (the direction in which holes move when the pMISFET is in an operation state). Then, with this compressive stress, holes are influenced by the piezo resistivity effect, so that the mobility of holes is increased. Herein, "substantially in the parallel direction" also means in a direction tilted by an angle of less than 10 degree from the direction in which electrons move.

Note that, instead of the internal stress films 8a and 8b, the semiconductor film itself in which the source and drain regions 3a, 4a, 3b and 4b are formed may be a film having an internal stress, for example, an uppermost semiconductor layer in an SOI substrate.

Furthermore, each of the internal stress films 8a and 8b does not have to be a single layer but may include multiple layers, as long as each of the internal stress films 8a and 8b can apply a stress to the substrate as a whole.

Moreover, in this embodiment, an Si (100) substrate is used. However, even if an Si (111) substrate is used, with the direction in which electrons move set to be the [001] direction, the mobility of electrons is increased by a tensile stress. In general, in any substrate plane directions, there is a direction of movement of electrons or holes, which allows increase in the mobility of electrons or holes according to the direction of a stress.

In this embodiment, the internal stress films 8a, and 8b exist on the source/drain regions 3a and 4a and the source/drain regions 3b and 4b, respectively. However, even when the internal stress film 8a exists only on one of the source/drain regions 3a and 4a and the internal stress film 8b exists only on one of the source/drain regions 3b and 4b, the effect of increasing the mobility of carriers can be obtained. In this case, the improvement rate of the mobility is reduced to half. In each of the following embodiments, when an internal stress film exits only on one of source/drain regions, the improvement rate of the mobility is reduced to half, compared to the case where internal stress films exist on source/drain regions, but the mobility is increased.

FIGS. 2A through 2C and FIGS. 3A through 3C are cross-sectional views illustrating respective steps for fabricating a semiconductor device according to the first embodiment of the present invention.

Figure 2A:
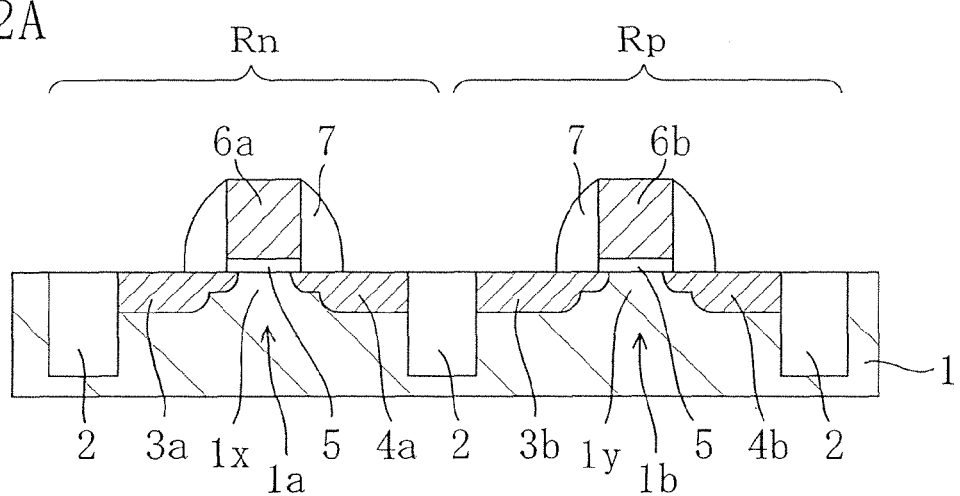
FIG. 2A through 2C are cross-sectional views illustrating first half of respective steps for fabricating the semiconductor device of the first embodiment.

First, in the process step of FIG. 2A, a trench and a buried oxide film are formed in part of a semiconductor substrate 1, i.e., an Si (100) substrate, thereby forming an isolation region 2 for dividing the substrate into active regions 1a, 1b and so on. Thereafter, after a gate insulating film 5 has been formed by thermal oxidation of respective surfaces of the active regions 1a and 1b and a polysilicon film for forming gate electrodes has been deposited, the polysilicon film and the gate insulating film 5 are etched by patterning using lithography and anisotropic dry etching, thereby forming gate electrodes 6a and 6b. The gate length direction of each of the gate electrodes 6a and 6b is the [011] direction. Next, using the gate electrode 6a of the nMISFET as a mask, ion implantation of an n-type impurity (e.g., arsenic) at a low concentration is performed to an nMISFET formation region Rn at an injection energy of 10 keV and a dose of $1\times10^{13}$/cm$^2$, and using the gate electrode 6b of the pMISFET as a mask, ion implantation of a p-type impurity (e.g., boron) at a low concentration is performed to a pMISFET formation region Rp at an injection energy of 2 keV and a dose of $1\times10^{15}$/cm$^2$. Thereafter, an insulating film which is for forming a sidewall and has a thickness of about 50 nm is deposited on the substrate and then a sidewall 7 is formed on side surfaces of the gate electrodes 6a and 6b by etch back. Next, using the gate electrode 6a of the nMISFET and the sidewall 7 as masks, ion implantation of an n-type impurity (e.g., arsenic) at a high concentration is performed to the nMISFET formation region Rn at an injection energy of 20 keV and a dose of $1\times10^{14}$/cm$^2$, and ion implantation of a p-type impurity (e.g., boron) at a high concentration is performed to the pMISFET formation region Rp at an injection energy of 5 keV and a dose of $1\times10^{16}$/cm$^2$. Thereafter, thermal treatment (RTA) for activating impurities is performed. By the above-described processing, source/drain regions 3a and 4a including an n-type lightly doped impurity region and an n-type heavily doped impurity region are formed in the nMISFET formation region Rn and source/drain regions 3b and 4b including a p-type lightly doped impurity region and a p-type heavily doped impurity region are formed in the pMISFET formation region Rp.

Figure 2B:
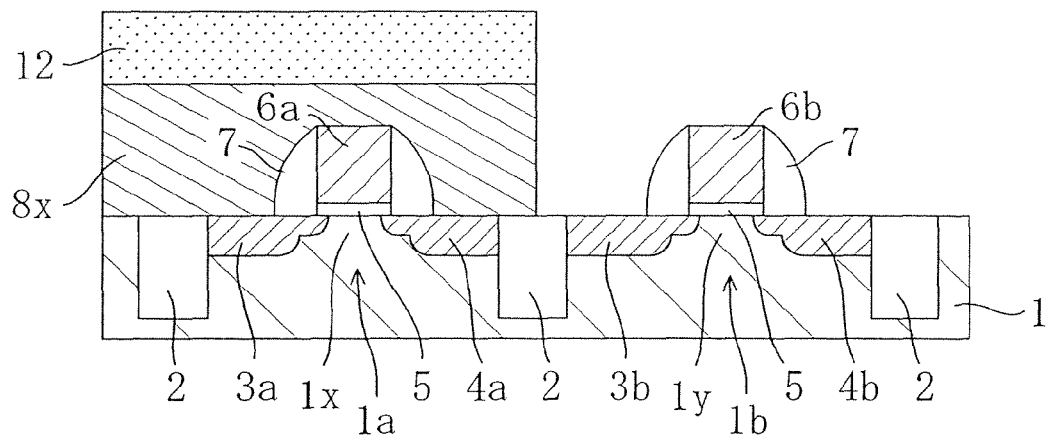

Next, in the process step of FIG. 2B, a silicon nitride film 8x is formed on the substrate so that the silicon nitride film 8x has a relatively large thickness and a surface thereof is flatted. At this point of time, the silicon nitride film 8x covers respective upper surfaces of the gate electrodes 6a and 6b of the MISFETs. Thereafter, a resist film 12 is formed on the silicon nitride film 8x by lithography and the silicon nitride film 8x is patterned using the resist film 12 as a mask so that the silicon nitride film 8x is left only on the nMISFET formation region Rn.

Figure 2C:
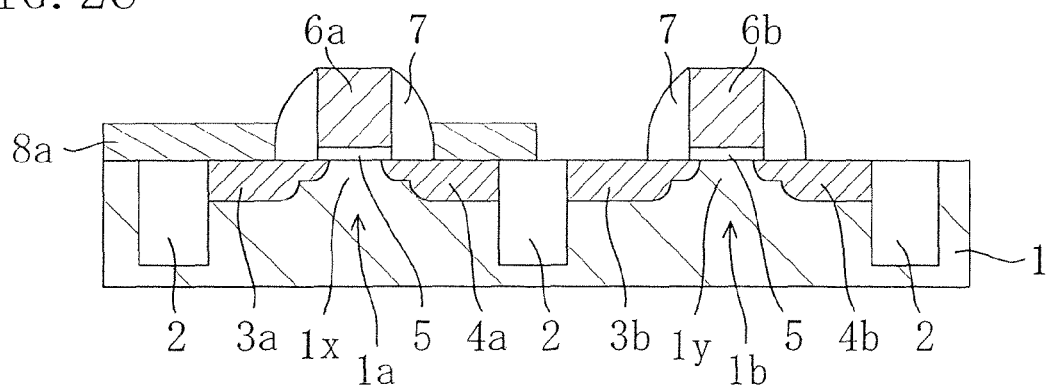

Next, in the process step of FIG. 2C, after the resist film 12 has been removed, the silicon nitride film 8x is etched back, part of the silicon nitride film 8x located on the gate electrode 6a is removed and the thickness of the silicon nitride film 8x is further reduced. Thus, a first-type internal stress film 8a is formed. That is, the first-type internal stress film 8a does not exist on the gate electrode 6a of the nMISFET but exits only on the source/drain regions 3a and 4a.

Figure 3A:
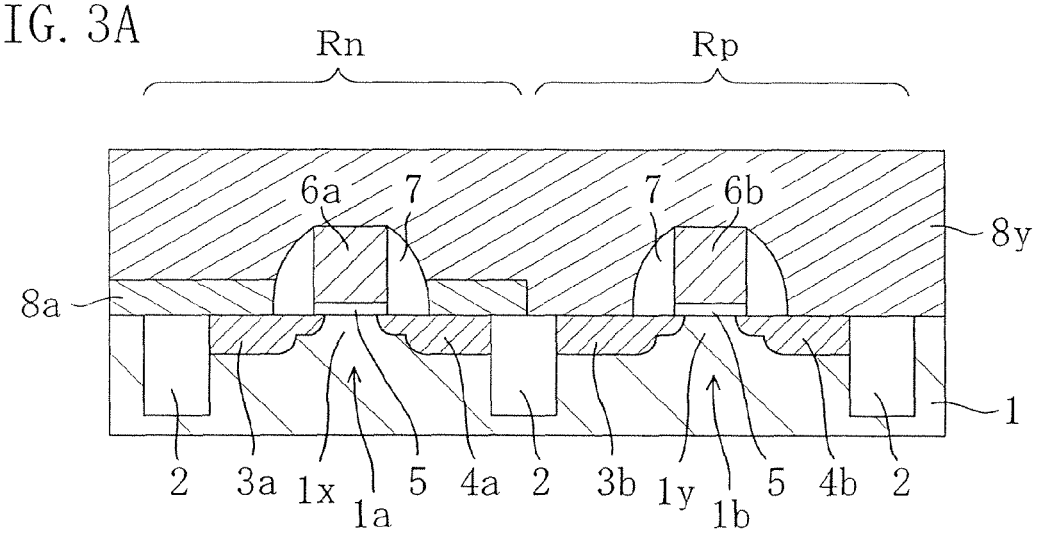
FIG. 3A through 3C are cross-sectional views illustrating latter half of respective steps for fabricating the semiconductor device of the first embodiment.

Next, in the process step of FIG. 3A, a TEOS film 8y is formed on the substrate so that the TEOS film 8y has a relatively large thickness and a surface thereof is flatted. At this point of time, the TEOS film 8y covers respective upper surfaces of the gate electrodes 6a and 6b of the MISFETs. Thereafter, a resist film (not shown) is formed on the TEOS film 8y by lithography and the TEOS film 8y is patterned using the resist film as a mask so that the TEOS film 8y is left only on the pMISFET formation region Rp.

Figure 3B:
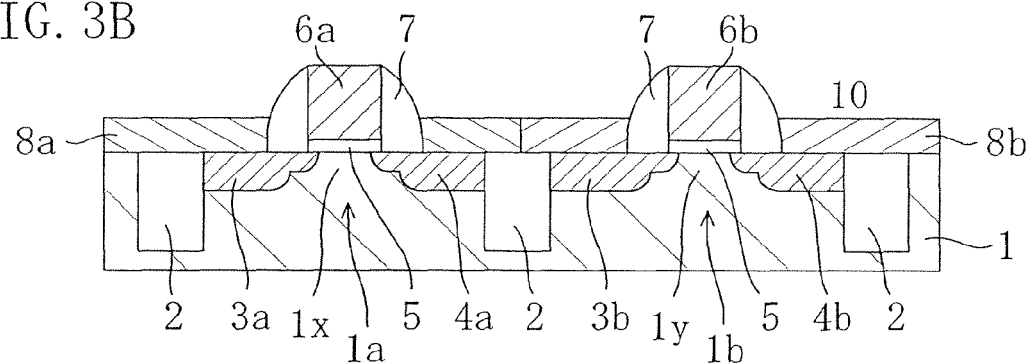

Next, in the process step of FIG. 3B, after the resist film has been removed, the TEOS film 8y is etched back, parts of the TEOS film 8y located on the gate electrodes 6a and 6b are removed and the thickness of the TEOS film 8y is further reduced. Thus, a second-type internal stress film 8b having substantially the same thickness as that of the first-type internal stress film 8a is formed. That is, the second-type internal stress film 8b does not exist on the gate electrode 6b of the pMISFET and the first-type internal stress film 8a but exists only on the source/drain regions 3b and 4b.

By the above-described process steps, the internal stress films 8a and 8b for applying stresses in opposite directions to each other are formed on the source/drain regions 3a and 4a of the nMISFET and the source/drain regions 3b and 4b of the pMISFET, respectively.

Figure 3C:
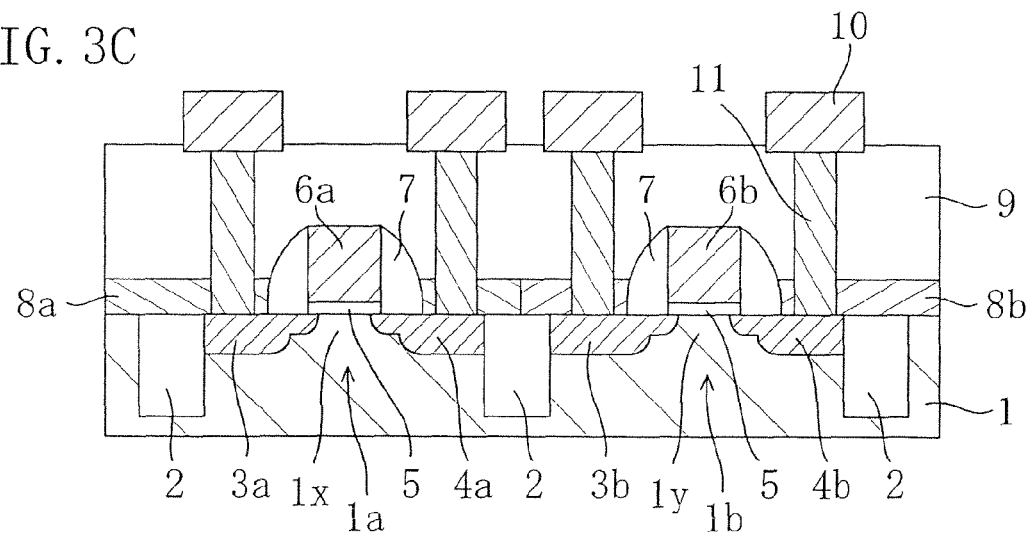

Next, in the process step of FIG. 3C, on the substrate, an interlevel insulating film 9 is formed and then contact holes are formed so as to pass through the interlevel insulating film 9 and reach the source/drain regions 3a and 4a of the nMISFET by lithography and dry etching, the source/drain regions 3b and 4b, and the gate electrodes 6a and 6b, respectively. Thereafter, each of the contact holes is filled with metal (e.g., tungsten), thereby forming contact plugs 11. Furthermore, a metal film such as an aluminum alloy film is deposited on the interlevel insulating film 9 and then the metal film is patterned, thereby forming a lead electrode 10 connected to each of the contact plugs 11. Thus, the respective source/drain regions 3a, 4a, 3b and 4b of the MISFETs and the gate electrodes 6a and 6b are made to be electrically connectable from the outside.

In the fabrication method of this embodiment, either one of the two types of internal stress films 8a and 8b may be formed first. And the internal stress films 8a and 8b may overlap with each other over the isolation region 2 and the source/drain regions 3a, 4a, 3b and 4b.

—First Modified Example of First Embodiment—

Figure 4A:
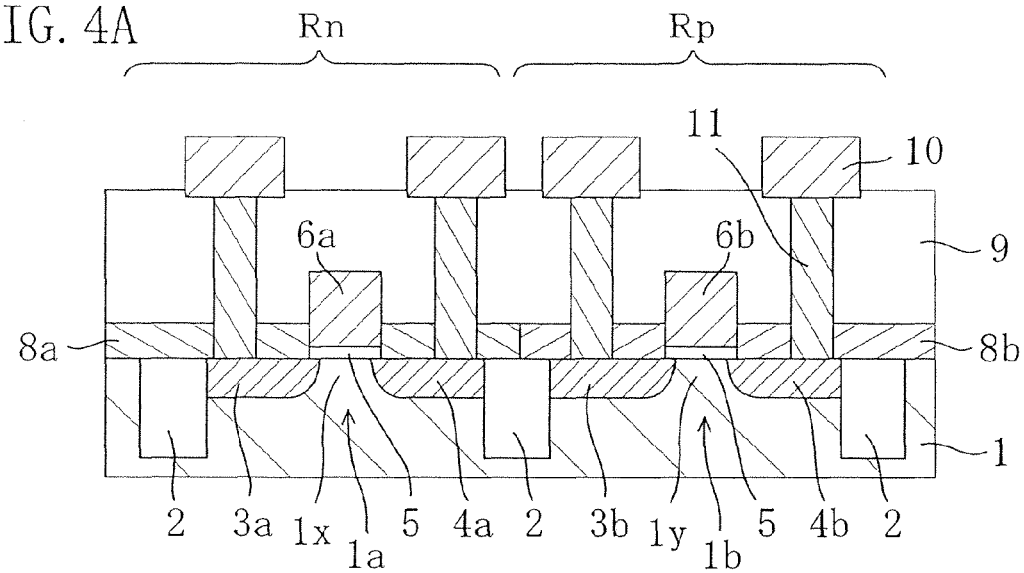
FIGS. 4A through 4C are cross-sectional views illustrating first, second and third modified examples of the first embodiment.
Figure 4B:
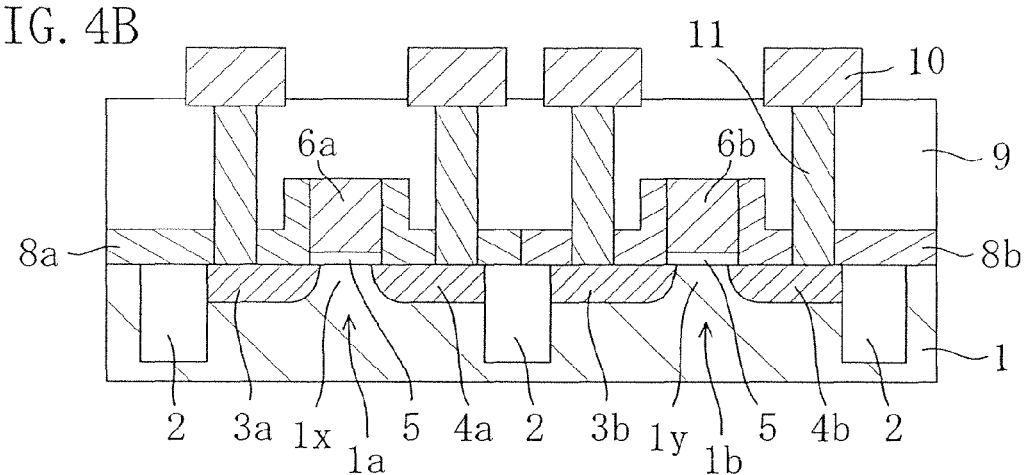
Figure 4C:
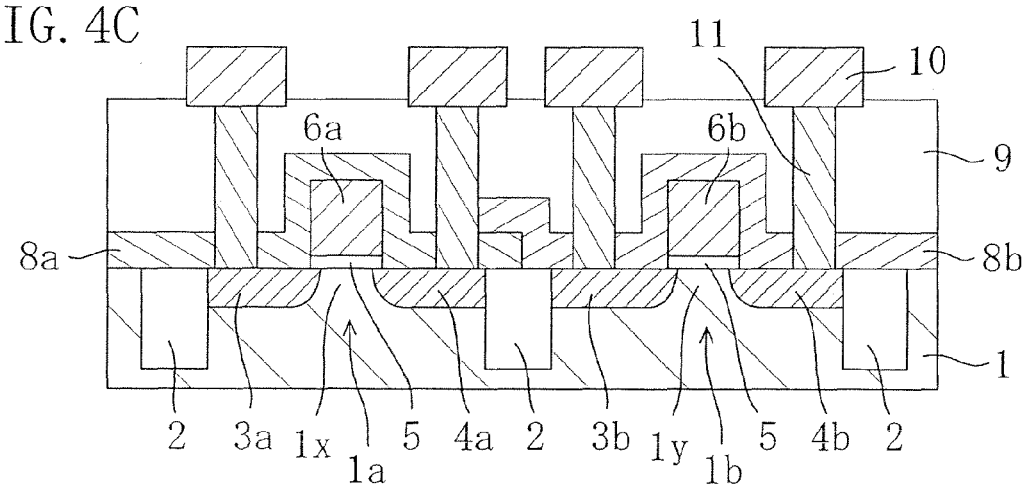

FIGS. 4A through 4C are cross-sectional views illustrating first through third modified examples of the first embodiment.

A semiconductor device according to a first modified example shown in FIG. 4A has a structure in which the sidewall 7 of the first embodiment is omitted. Moreover, each of the source/drain regions 3a, 4a, 3b and 4b does not include a lightly doped impurity region and includes only a heavily doped impurity region. Other part has the same structure as that of the semiconductor device of the first embodiment. In this modified example, no sidewall exists in forming an internal stress film, so that a space between respective parts of the source/drain regions 3a and 4a being in contact with the first-type internal stress film 8a is small. Thus, a stress applied to each of the channel regions 1x and 1y is increased, so that the effect of improving the carrier mobility becomes larger than that of the first embodiment.

A semiconductor device according to a second modified example shown in FIG. 4B has a structure in which instead of the sidewall 7 of the first embodiment, which is made of a silicon oxide film, the first-type internal stress film 8a made of a silicon nitride film covers a side surface of the gate electrode 6a of the nMISFET and the second-type internal stress film 8b made of a TEOS film covers a side surface of the gate electrode 6b of the pMISFET. Moreover, each of the source/drain regions 3a, 4a, 3b and 4b does not include a lightly doped impurity region and includes only a heavily doped impurity region. Other part has the same structure as that of the semiconductor device of the first embodiment.

In this modified example, in addition to the effect of the first modified example, the following effect can be obtained. In the nMISFET, the first-type internal stress film 8a and the gate electrode 6a are in contact with each other substantially at the entire side surface of the gate electrode 6a, so that the gate electrode 6a is compressed downwardly by the first-type internal stress film 8a. With the gate electrode 6a compressed downwardly, then, in the channel region 1x, a compressive stress is generated in the vertical direction to the principal surface and the mobility of electrodes in the nMISFET is further improved.

Moreover, in the pMISFET, the second-type internal stress film 8b and the gate electrode 6b are in contact with each other substantially at the entire side surface of the gate electrode 6b, so that the gate electrode 6b is stretched upwardly by the second-type internal stress film 8b. With the gate electrode 6b stretched upwardly, then, in the channel region 1y, a tensile stress is generated in the vertical direction to the principal surface and the mobility of holes in the pMISFET is further improved.

Therefore, in this structure, the improvement rate of the mobility is further increased, compared to the first modified example.

A semiconductor device according to a third modified example shown in FIG. 4C has a structure in which instead of the sidewall 7 of the first embodiment, which is made of a silicon oxide film, the first-type internal stress film 8a made of a silicon nitride film covers side and upper surfaces of the gate electrode 6a of the nMISFET and the second-type internal stress film 8b made of a TEOS film covers side and upper surfaces of the gate electrode 6b of the pMISFET. Moreover, each of the source/drain regions 3a, 4a, 3b and 4b does not include a lightly doped impurity region and includes only a heavily doped impurity region. Other part has the same structure as that of the semiconductor device of the first embodiment.

In this modified example, in addition to the effect of the second modified example, the following effect can be obtained. In the nMISFET, the first-type internal stress film 8a and the gate electrode 6a are in contact with each other substantially at the entire side and upper surfaces of the gate electrode 6a, so that the effect of compressing the gate electrode 6a downwardly by the first-type internal stress film 8a becomes larger. With the gate electrode 6a compressed downwardly more strongly, then, in the channel region 1x, a compressive stress is generated in the vertical direction to the principal surface and the mobility of electrons in the nMISFET is further improved.

Moreover, in the pMISFET, the second-type internal stress film 8b and the gate electrode 6b are in contact with each other substantially at the entire side and upper surfaces, so that the stress of stretching the gate electrode 6b upwardly by the second-type internal stress film 8b becomes larger. With the gate electrode 6b stretched upwardly more strongly, then, in the channel region 1y, a tensile stress is generated in the vertical direction to the principal surface and the mobility of holes in the pMISFET is further more improved.

Therefore, in this structure, the improvement rate of the mobility is further increased, compared to the second modified example.

In each of the first through third modified examples, only the heavily doped impurity regions are provided as the source/drain regions. However, the source/drain regions may be source/drain regions including a lightly doped impurity region and a heavily doped impurity region. In this case, as shown in FIG. 2A, a lightly doped impurity region and a heavily doped impurity region are formed using a gate electrode and a sidewall, and then, after the sidewall has been removed, an internal stress film is formed in the manner shown in FIGS. 4A through 4C. Thus, source/drain regions including a lightly doped impurity region and a heavily doped impurity region can be formed.

—Fabrication Method According to First Modified Example—

FIGS. 5A through 5D are cross-sectional views illustrating respective steps for fabricating a semiconductor device according to the first modified example of the first embodiment.

Figure 5A:
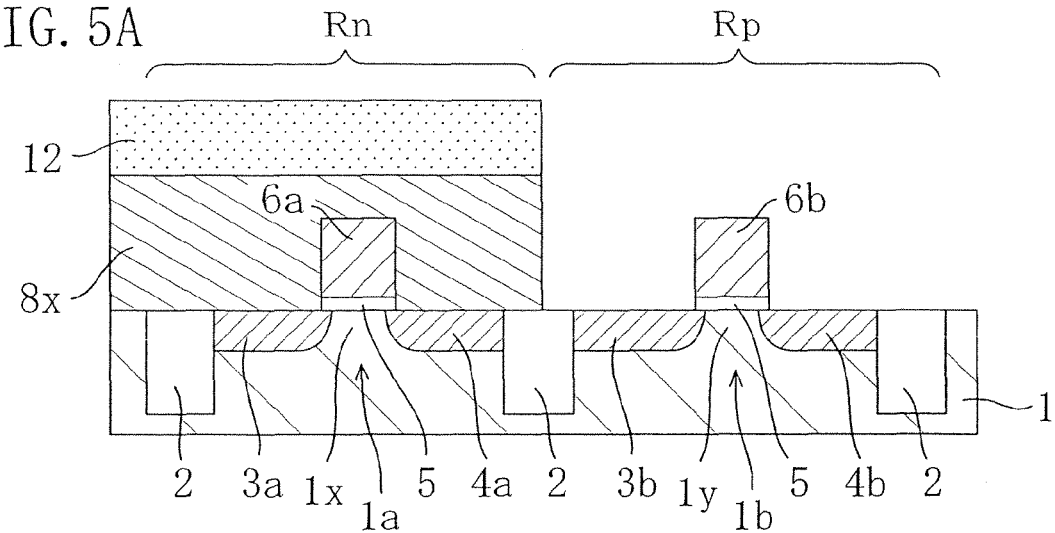
FIGS. 5A through 5D are cross-sectional views illustrating respective steps for fabricating a semiconductor device according to the first modified example of the first embodiment.

First, before the process step of FIG. 5A, the same process step as that of FIG. 2A in the first embodiment is performed to faun an isolation region 2 for dividing a substrate into active regions 1a, 1b and so on, a gate insulating film 5, gate electrodes 6a and 6b, source/drain regions 3a and 4a each including only an n-type heavily doped impurity region and source/drain regions 3b and 4b each including only a p-type heavily doped impurity region. In this case, each of the source/drain regions 3a, 4a, 3b and 4b includes only a heavily doped impurity region. However, the source/drain regions 3a, 4a, 3b and 4b may be source/drain regions each including a lightly doped impurity region and a heavily doped impurity region. In that case, by the process step of FIG. 2A, after a heavily doped impurity region has been formed using the sidewall as a mask, the sidewall is removed. Thus, source/drain regions each including a lightly doped impurity region and a heavily doped impurity region can be formed.

Next, in the process step of FIG. 5A, a silicon nitride film 8x is formed on the substrate so that the silicon nitride film 8x has a relatively large thickness and a surface thereof is flatted. At this point of time, the silicon nitride film 8x covers respective upper surfaces of the gate electrodes 6a and 6b of the MISFETs. Thereafter, a resist film 12 is formed on the silicon nitride film 8x by lithography and the silicon nitride film 8x is patterned using the resist film 12 as a mask so that the silicon nitride film 8x is left on the nMISFET formation region Rn.

Figure 5B:
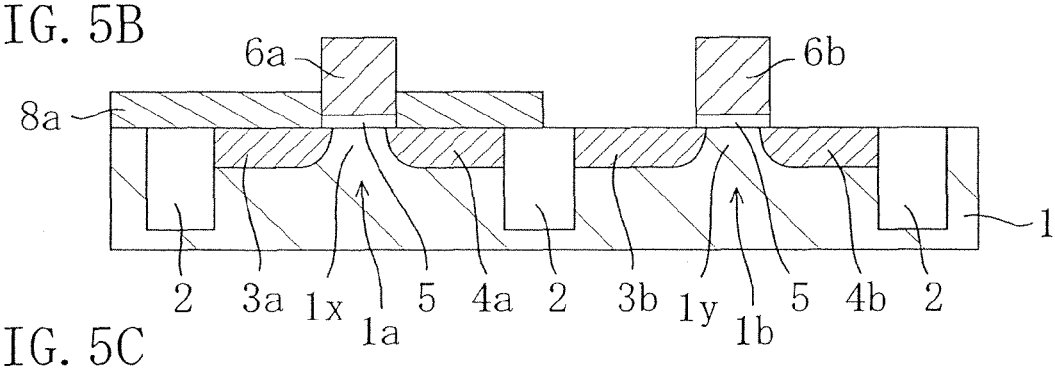

Next, in the process step of FIG. 5B, after the resist film 12 has been removed, the silicon nitride film 8x is etched back, part of the silicon nitride film 8x located on the gate electrode 6a is removed and the thickness of the silicon nitride film 8x is further reduced. Thus, a first-type internal stress film 8a having a thickness of about 20 µm is formed. That is, the first-type internal stress film 8a does not exist on the gate electrode 6a of the nMISFET but exists only on the source/drain regions 3a and 4a.

Figure 5C:
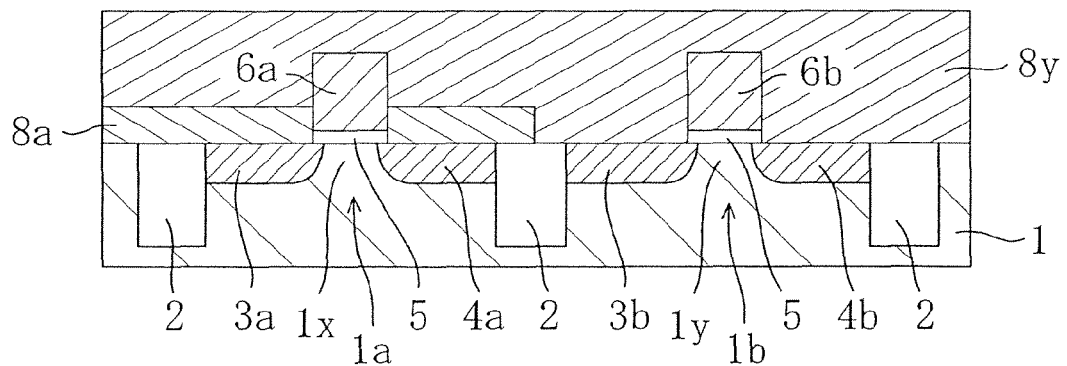

Next, in the process step of FIG. 5C, a TEOS film 8y is formed on the substrate so that the TEOS film 8y has a relatively large thickness and a surface thereof is flatted. At this point of time, the TEOS film 8y covers respective upper surfaces of the gate electrodes 6a and 6b of the MISFETs.

Figure 5D:
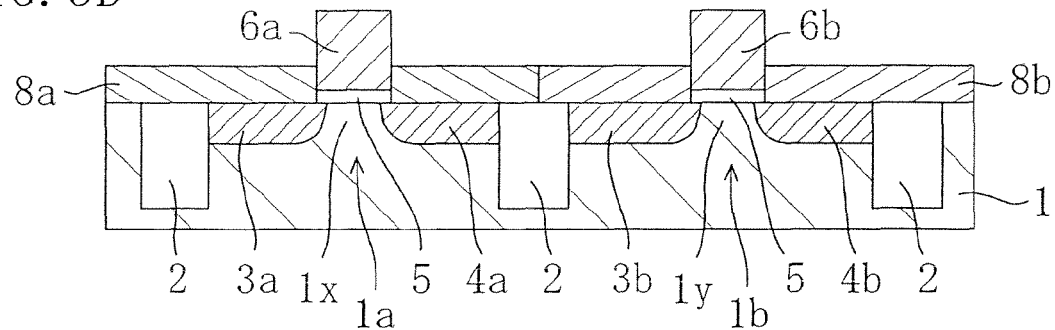

Next, in the process step of FIG. 5D, the TEOS film 8y is etched back, parts of the TEOS film 8y located on the first-type internal stress film 8a and the gate electrode 6b of the pMISFET are removed and the thickness of the TEOS film 8y is further reduced. Thus, a second-type internal stress film 8b having substantially the same thickness as that of the first-type internal stress film 8a is formed.

By the above-described process steps, the internal stress films 8a and 8b for applying stresses in opposite directions to each other are formed on the source/drain regions 3a and 4a of the nMISFET and on the source/drain regions 3b and 4b of the pMISFET, respectively.

Although illustration of the subsequent process step will be omitted, the same process step as that of FIG. 3C is performed to form an interlevel insulating film, contact holes reaching the source/drain regions 3a and 4a of the nMISFET, the source/drain regions 3b and 4b of the pMISFET, and the gate electrodes 6a and 6b, respectively, through the insulating film 9, and contact plugs 11. Furthermore, lead electrodes are formed on the interlevel insulating film, so that the source/drain regions 3a, 4a, 3b and 4b and the gate electrodes 6a and 6b of the MISFETs becomes electrically connectable from the outside.

According to this embodiment, by forming the first-type internal stress film 8a and the second-type internal stress film 8b, the structure shown in FIG. 4A can be obtained. Thus, no sidewall exists, so that a space between respective parts of the source/drain regions 3a and 4a which are in contact with the first-type internal stress film 8a is small. Accordingly, a stress applied to each of the channel regions 1x and 1y is increased, so that the effect of improving the carrier mobility becomes larger than that of the first embodiment. The distance between the active region 1a and the first-type internal stress film 8a is reduced, so that a tensile stress generated in the active region is increased.

—Fabrication Method According to Third Modified Example—

Figure 6A:
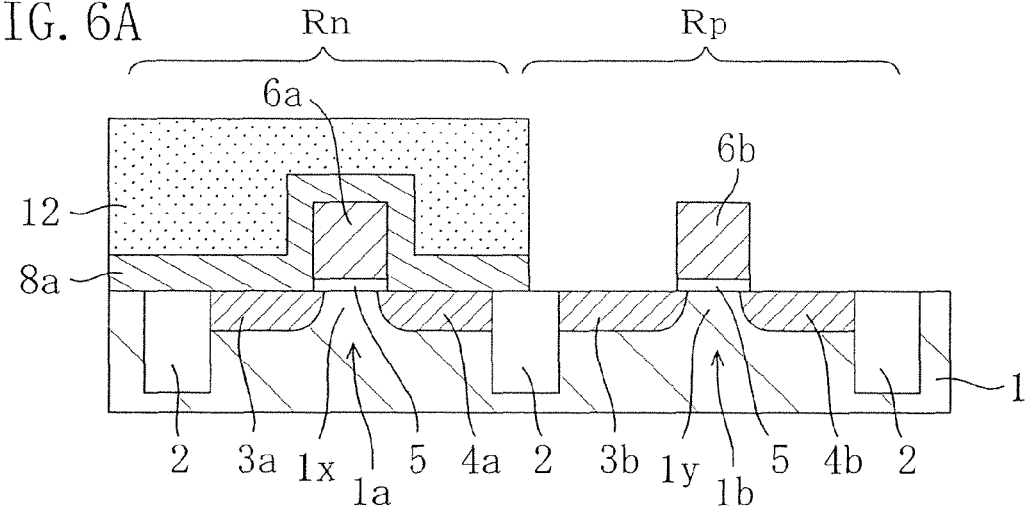
FIGS. 6A through 6C are cross-sectional views illustrating respective steps for fabricating a semiconductor device according to the third modified example of the first embodiment.
Figure 6B:
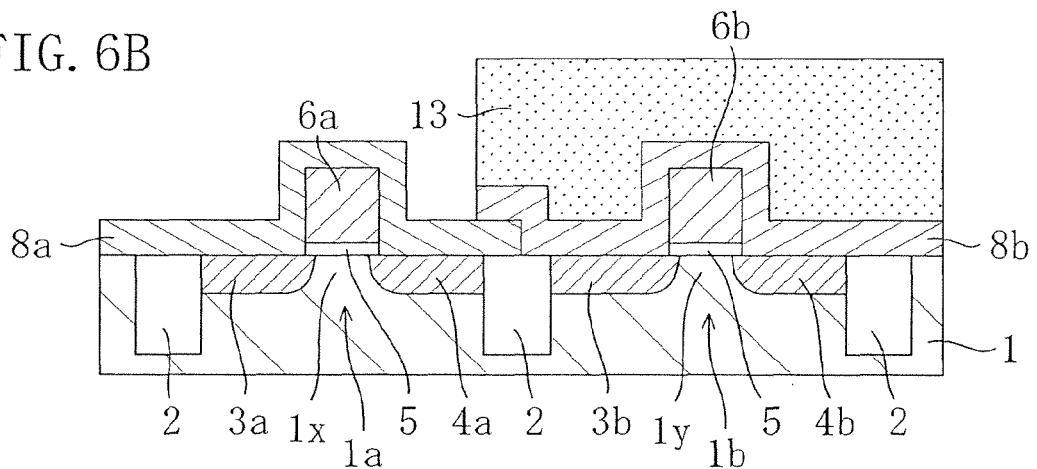
Figure 6C:
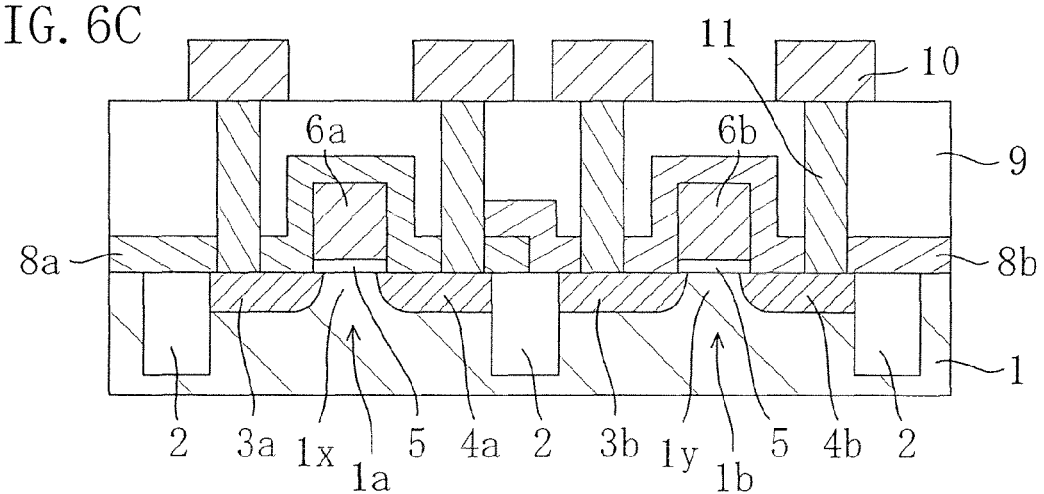

FIGS. 6A through 6C are cross-sectional views illustrating respective steps for fabricating a semiconductor device of the third modified example of the first embodiment.

First, before the process step of FIG. 6A, the same process step as that of FIG. 2A in the first embodiment is performed to form an isolation region 2 for dividing a substrate into active regions 1a, 1b and so on, a gate insulating film 5, gate electrodes 6a and 6b, source/drain regions 3a and 4a each including only an n-type heavily doped impurity region and source/drain regions 3b and 4b each including only a p-type heavily doped impurity region. In this case, each of the source/drain regions 3a, 4a, 3b and 4b includes only a heavily doped impurity region. However, the source/drain regions 3a, 4a, 3b and 4b may be source/drain regions each including a lightly doped impurity region and a heavily doped impurity region. In that case, by the process step of FIG. 2A, after a heavily doped impurity region has been formed using the sidewall as a mask, the sidewall is removed.

Next, in the process step of FIG. 6A, a silicon nitride film having a smaller thickness than those of the gate electrodes 6a and 6b, i.e., a thickness of about 20 nm is formed on the substrate. At this point of time, the silicon nitride film covers side and upper surfaces of the gate electrodes 6a and 6b of the MISFETs. Thereafter, a resist film 12 is formed on the silicon nitride film by lithography and the silicon nitride film is patterned using the resist film 12 as a mask, thereby forming a compressive stress film 8a made of the silicon nitride film only in an nMISFET formation region Rn.

Next, in the process step of FIG. 6B, after the resist film 12 has been removed, a TEOS film having a smaller thickness than those of the gate electrodes 6a and 6b, i.e., a thickness of about 20 nm is formed on the substrate. At this point of time, the TEOS film covers side and upper surfaces of the gate electrodes 6a and 6b of the MISFETs as well as part of the first-type internal stress film 8a. Next, a resist film 13 is formed on the TEOS film by lithography and the TEOS film is patterned using the resist film 13 as a mask to remove part of the TEOS film located on the gate electrode 6b of a pMISFET, thereby forming a second-type internal stress film 8b which overlaps with the first-type internal stress film 8a over the isolation region 2. At this point of time, ideally, it is more preferable that the first-type internal stress film 8a and the second-type internal stress film 8b do not overlap with each other. However, even though the first-type internal stress film 8a and the second-type internal stress film 8b overlap with each other over the isolation region 2 or the source/drain regions, a stress which the second-type internal stress film 8b applied to the active region 1a is small because there is a large distance therebetween.

By the above-described process steps, the internal stress films 8a and 8b for applying stresses in opposite directions to each other are formed on the source/drain regions 3a and 4a of the nMISFET and the source/drain regions 3b and 4b of the pMISFET, respectively.

Next, in the process step of FIG. 6C, the resist film 13 is removed and then the same process step as that of FIG. 3C in the first embodiment is performed to form an interlevel insulating film 9, contact holes reaching the source/drain regions 3a and 4a of the nMISFET, the source/drain regions 3b and 4b of the pMISFET, and the gate electrodes 6a and 6b, respectively, through the insulating film 9, and contact plugs 11. Furthermore, lead electrodes 10 are formed on the interlevel insulating film 9, so that the respective source/drain regions 3a, 4a, 3b and 4b and the gate electrodes 6a and 6b of the MISFETS can be electrically accessed from the outside.

The semiconductor device of this modified example has a structure in which the first-type internal stress film 8a made of a silicon nitride film covers the side and supper surfaces of the gate electrode 6a of the nMISFET and the second-type internal stress film 8b made of a TEOS film covers the side and upper surfaces of the gate electrode 6b of the pMISFET. Other part has the same structure as that of the semiconductor device of the first embodiment.

In this modified example, the following effect can be obtained. In the nMISFET, the first-type internal stress film 8a and the gate electrode 6a are in contact with each other substantially at the entire side and upper surfaces of the gate electrode 6a, so that the gate electrode 6a is strongly compressed downwardly by the first-type internal stress film 8a. With the gate electrode 6a compressed downwardly, then, in the channel region 1x, a compressive stress is generated in the vertical direction to the principal surface. In this embodiment, the Si (100) substrate is used and the direction of movement of electrons is the [011] direction, so that the mobility of electrons in the nMISFET is further improved by this compressive stress.

Moreover, in the pMISFET, the second-type internal stress film 8b and the gate electrode 6b are in contact with each other substantially at the entire side and upper surfaces of the gate electrode 6b, so that the gate electrode 6b is strongly streched upwardly by the second-type internal stress film 8b. With the gate electrode 6b stretched upwardly, then, in the channel region 1y, a tensile stress is generated in the vertical direction to the principal surface. In this embodiment, the Si (100) substrate is used and the direction of movement of holes is the [011] direction, so that the mobility of holes in the pMISFET is further improved by this tensile stress.

Furthermore, in the fabrication method of this embodiment, in the process step of forming the first-type internal stress film 8a of a silicon nitride film and the process step of forming the second-type internal stress film 8b of a TEOS film, patterning is performed, instead of etch back. Therefore, the fabrication method is more simplified.

(Second Embodiment)

FIGS. 7A through 7D and FIGS. 8A through 8D are cross-sectional views illustrating respective steps for fabricating a semiconductor device according to a second embodiment of the present invention.

Figure 7A:
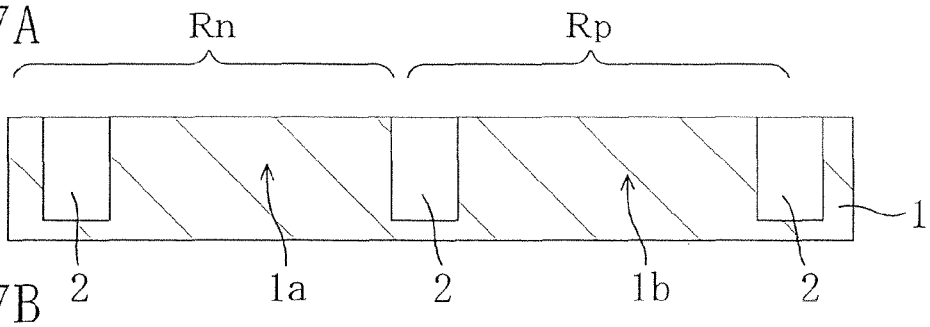
FIGS. 7A through 7D are cross-sectional views illustrating first half of respective steps for fabricating a semiconductor device according to a second embodiment of the present invention.

First, in the process step of FIG. 7A, a trench and a buried oxide film are formed in part of a semiconductor substrate 1, thereby forming an isolation region 2 for dividing the substrate into active regions 1a, 1b and so on.

Figure 7B:
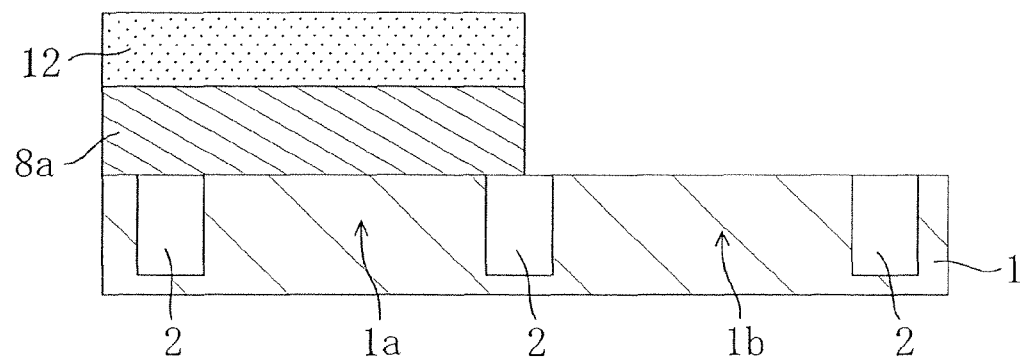

Next, in the process step of FIG. 7B, a silicon nitride film is formed on the substrate so as to have a larger thickness than that of a gate electrode. At this point of time, a gate electrode of each MISFET is not formed and thus the silicon nitride film covers each of the active regions 1a and 1b and the isolation region 2. Thereafter, a resist film 12 is formed on the silicon nitride film by lithography and then the silicon nitride film is patterned using the resist film 12 as a mask, thereby forming a first-type internal stress film 8a made of the silicon nitride film only in an nMISFET formation region Rn.

Figure 7C:
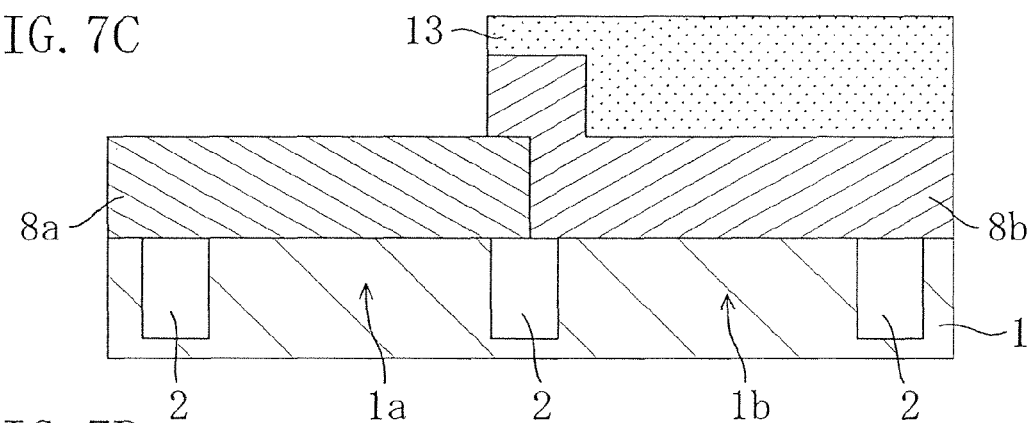

Next, in the process step of FIG. 7C, a TEOS film is formed on the substrate so as to have a larger thickness than that of a gate electrode. At this point of time, a gate electrode of each MISFET is not formed and thus the TEOS film covers part of the first-type internal stress film 8a, the active region 1b and the isolation region 2. Thereafter, a resist film 13 is formed on the TEOS film and the TEOS film is patterned using the resist film 13 as a mask, thereby forming a second-type internal stress film 8b made of the TEOS film in a pMISFET formation region Rp. In this case, the first-type internal stress film 8a and the second-type internal stress film 8b overlap with each other over the isolation region 2.

Figure 7D:
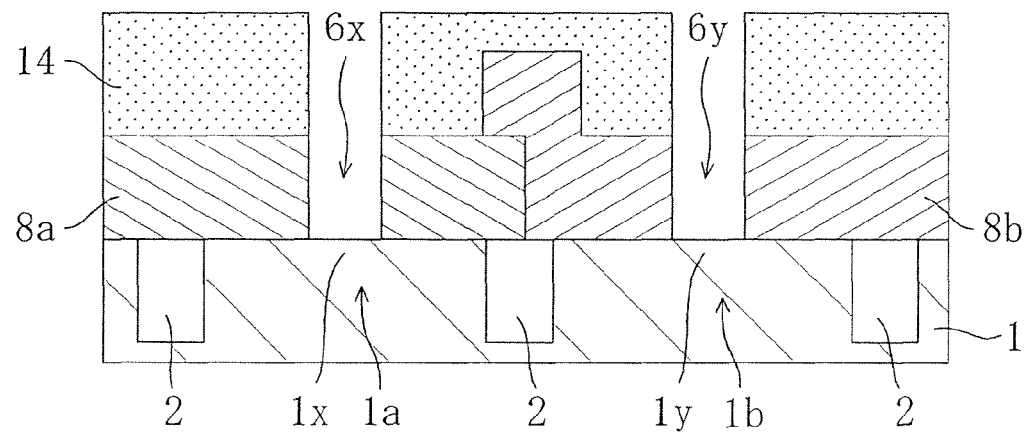

Next, in the process step of FIG. 7D, a resist film 14 is formed on the first-type internal stress film 8a and the second-type internal stress film 8b by lithography so as to have openings each corresponding to a gate formation region of each MISFET and then the first-type internal stress film 8a and the second-type internal stress film 8b are etched using the resist film 14 as a mask, thereby forming grooves 6x and 6y each of which reaches an upper surface of the semiconductor substrate 1. In this case, a tensile stress in the lateral direction is generated in a channel region 1x of the active region 1a by the first-type internal stress film 8a and a compressive stress is generated in a channel region 1y of the active region 1b.

Next, in the process step of FIG. 8A, after the resist film 14 has been removed, thermal treatment is performed to regions of the semiconductor substrate 1 exposed at the respective bottoms of the grooves 6x and 6y, thereby forming a gate insulating film 5. Next, a polysilicon film 6 is deposited in the grooves 6x and 6y and on the first-type internal stress films 8a and the second-type internal stress film 8b to a thickness with which the upper surface of the polysilicon film 6 becomes substantially flatted.

Next, in the process step of FIG. 8B, the polysilicon film 6 is etched back to remove parts of the polysilicon film 6 located over the first-type internal stress film 8a and the second-type internal stress film 8b and to fill each of the grooves 6x and 6y with the polysilicon film, thereby forming gate electrodes 6a and 6b. Furthermore, lithography and ion implantation are performed to dope the gate electrode 6a of the nMISFET formation region Rn with an n-type impurity and the gate electrode 6b of the pMISFET formation region Rp with a p-type impurity, thereby reducing the resistance of each of the gate electrodes 6a and 6b.

Next, in the process step of FIG. 8C, after the internal stress films 8a and 8b have been removed by selective etching, lithography and ion implantation using each of the gate electrodes 6a and 6b as a mask are performed so that n-type and p-type impurities are injected into the nMISFET formation region Rn and the pMISFET formation region Rp, respectively. Thus, source/drain regions 3a and 4a each including only an n-type heavily doped impurity region of the nMISFET and source/drain regions 3b and 4b each including only a p-type heavily doped impurity region of the pMISFET are formed. Stresses which have been applied to the channel regions 1x and 1y by the internal stress films 8a and 8b are reduced by removing the internal stress films 8a and 8b. However, the gate insulating film 6 is formed with stresses generated in the channel regions 1x and 1y, and therefore, the gate insulating film 5 holds stresses in the channel regions 1x and 1y, i.e., regions of the substrate located directly under the gate insulating film 5. For example, assume that an Si (100) substrate is used as the semiconductor substrate 1 and a silicon oxide film is used as the gate insulating film 5. When the internal stress films 8a and 8b are removed, each of stresses in the channel regions 1x and 1y is reduced to one fourth because the ratio between the respective Young's moduli of the silicon oxide film and the Si (100) substrate is 1:3. To keep each of a tensile stress and a compressive stress at a large level, an insulation material of which the Young's modulus is larger than that of the Si (100) substrate can be used as the gate insulating film 5. A silicon nitride film is an example of insulation materials with a larger Young's modulus than that of the Si (100) substrate. In this case, each of the source/drain regions 3a, 4a, 3b and 4b includes only a heavily doped impurity region. However, the source/drain regions 3a, 4a, 3b and 4b may be source/drain regions each including a lightly doped impurity region and a heavily doped impurity region. In that case, after a lightly doped impurity region has been formed by ion implantation at a low concentration using a gate electrode as a mask, a sidewall can be formed on a side surface of the gate electrode and then a heavily doped impurity region can be formed by ion implantation at a high concentration using the sidewall as a mask.

Next, in the process step of FIG. 8D, the same process step as that of FIG. 3C in the first embodiment is performed to form an interlevel insulating film 9, contact holes reaching the source/drain regions 3a and 4a of the nMISFET, the source/drain regions 3b and 4b of the pMISFET, and the gate electrodes 6a and 6b, respectively, through the insulating film 9, and contact plugs 11. Furthermore, lead electrodes 10 are formed on the interlevel insulating film 9, so that the respective source/drain regions 3a, 4a, 3b and 4b and the gate electrodes 6a and 6b of the MISFETs can be electrically accessed from the outside.

In this embodiment, compared to the first embodiment, the following advantage can be obtained. In the first embodiment, there is possibility that when stresses are generated in the channel regions 1x and 1y, stresses to be generated by the first-type internal stress film 8a and the second-type internal stress film 8b in the channel regions 1x and 1y might be interrupted by the gate electrodes 6a and 6b and then reduced because the gate electrodes 6a and 6b exist. In contrast, in this embodiment, when the grooves 6x and 6y are formed in the process step of FIG. 7D, the semiconductor substrate 1 is the only member which is in contact with the internal stress films 8a and 8b. Therefore, a stress applied to each of the channel regions 1x and 1y is increased.

Note that in this embodiment, a polysilicon film which is doped with an impurity is used for the gate electrodes 8a and 8b. However, if as a film for forming the gate electrodes 8a and 8b, a film which is conductive without being doped with an impurity (for example, a metal film such as a copper film, a tungsten film, a cobalt film and a nickel film) is used instead of a polysilicon film, the subsequent ion implantation is not necessary. Therefore, fabrication process steps can be simplified.

Moreover, in this embodiment, the internal stress films 8a and 8b are removed for the purpose of performing ion implantation for forming the source/drain regions 3a, 4a, 3b and 4b. However, if the thicknesses of the internal stress films 8a and 8b are small, impurity ions can be injected into the semiconductor substrate 1 through the internal stress films 8a and 8b. Therefore, the internal stress films 8a and 8b can be left without being removed.

Moreover, in the process step of FIG. 8A, exposed part of a surface portion of the semiconductor substrate is thermally oxidized to form a gate insulating film. However, a gate insulating film can be deposited by CVD or PVD. In that case, an insulating film (e.g., a silicon oxide film) for forming a gate insulating film is left on a side surface of each of the gate electrodes 6a and 6b. Even if this insulating film if left as a sidewall, no problem is caused.

(Third Embodiment)

Figure 9A:
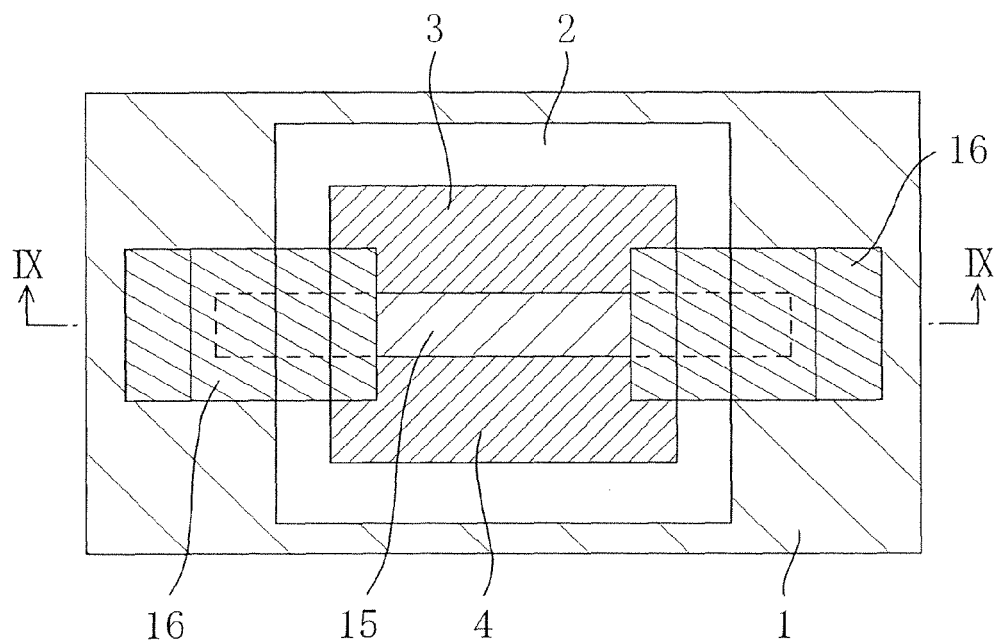
FIGS. 9A and 9B are a plane view of an MISFET of a semiconductor device according to a third embodiment of the present invention and a cross-sectional view illustrating a cross-sectional structure taken along the line IX-IX (a cross section in the gate width direction), respectively.
Figure 9B:
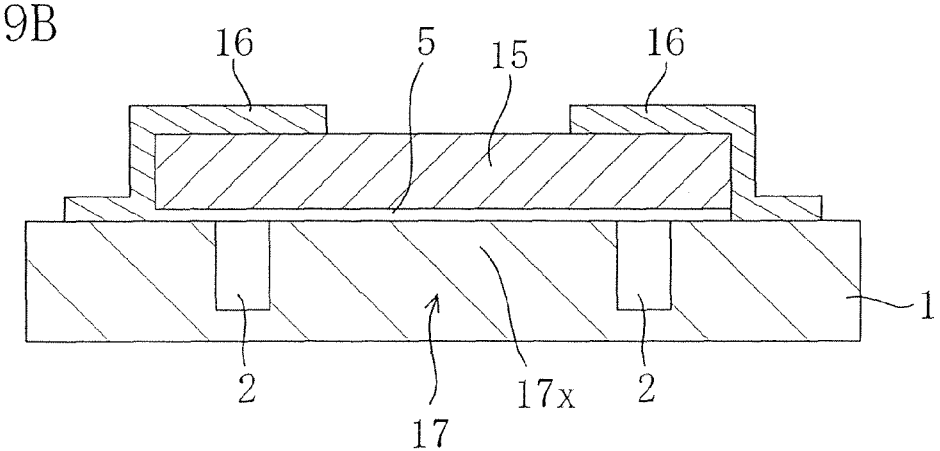

FIGS. 9A and 9B are a plane view of an MISFET in a semiconductor device according to a third embodiment of the present invention and a cross-sectional view illustrating a cross-sectional structure taken along the line IX-IX (a cross section in the gate width direction), respectively. In this embodiment, a structure for generating a stress in the gate width direction of a MISFET, i.e., in the direction which is parallel to the principal surface of a semiconductor substrate and vertical to the direction of movement of carriers will be described.

As shown in FIGS. 9A and 9B, in an active region 17 of a semiconductor substrate 1, i.e., an Si (100) substrate, provided is a MISFET including a gate insulating film 5, a gate electrode 15 and source/drain regions 3 and 4. The MISFET may be either an nMISFET or a pMISFET. Moreover, at each of both ends of the gate electrode 15, first-type internal stress films 16 which spreads over part of side, end and upper surfaces of the gate electrode 15, the semiconductor substrate 1 and the isolation region 2 and is made of a silicon nitride film are provided.

In this embodiment, a compressive stress is generated by each of the first-type internal stress films 16 at each end of each of the source/drain regions 3 and 4 located directly under the first-type internal stress films 16. In regions of the source/drain regions 3 and 4 on which the first-type internal stress film 16 is not located, a tensile stress is generated in the gate width direction. Furthermore, with the gate electrode 15 having both ends thereof compressed by the first-type internal stress films 16, a tensile stress is generated in the gate width direction in part of the gate electrode 15 on which the first-type internal stress films 16 are not located. As a result, in the channel region 17x, a stress due to the source/drain regions 3 and 4 to which a tensile stress is applied and a stress due to the channel region 17x stretched by the gate electrode 15 to which a tensile stress is applied are generated, so that a large tensile stress is generated in the gate width direction. The direction of the tensile stress is the parallel direction to the principal surface of the semiconductor substrate 1 and also the vertical direction to the direction in which carriers move. Assume that an Si (100) substrate is used as the semiconductor substrate 1 and the gate length direction is set to be the [011] direction. Whether carriers running through the channel region 17x are electrons or holes (i.e., in each of an nMISFET and a pMISFET), the mobility of carriers is improved due to the piezo resistivity effect.

Note that in the structure shown in FIGS. 9A and 9B, the two first-type internal stress films 16 cover parts of the side and upper surfaces of the gate electrode 15 located at respective end portions of the gate electrode 15. However, even if the two first-type internal stress films 16 cover only the side surface of the gate electrode 15, a tensile stress in the gate width direction in the channel region 17x can be generated.

Furthermore, even in the case where the first-type internal stress film 16 is provided only at one end of the gate electrode 15, a tensile stress at a certain level can be generated.

Moreover, in addition to this structure, another first-type internal stress film may be provided under each of end portions of the gate electrode 15.

As has been described above, according to the present invention, a stress is generated in a semiconductor device by an internal stress film, so that a stress can be generated in an arbitrary location on the semiconductor substrate using semiconductor process steps which show affinity to present process steps for fabricating a semiconductor device, thus resulting in increase in the mobility of carriers.

What is claimed is:

1. A method for fabricating a semiconductor device, comprising the steps of:
    a) forming over an active region of a semiconductor substrate an internal stress film having a stress internally;
    b) forming a groove reaching the active region through the internal stress film;
    c) forming a gate insulating film over part of a surface of the semiconductor substrate exposed at a bottom surface of the groove;
    d) filling, after the step c), the groove with a conductive film, thereby forming a gate electrode; and
    e) performing, after the internal stress film has been removed, ion implantation of an impurity of a first conductive type to the active region using the gate electrode as a mask, thereby forming source/drain regions.

2. The method of claim 1, further comprising:
    before or after the step a), the step of forming over another active region of the semiconductor substrate another internal stress film having a stress in the opposite direction to that of the internal stress film internally,
    wherein in the step b), another groove reaching said another active region through said another internal stress film,
    wherein in the step c), another gate insulating film is formed over part of the surface of the semiconductor substrate exposed at a bottom surface of said another groove,
    wherein in the step d), said another groove is filled with a conductive film, thereby forming another gate electrode, and
    wherein the method further comprises the step of performing, after said another internal stress film has been removed, ion implantation of an impurity of a second conductive type to said another active region using said another gate electrode as a mask, thereby forming other source/drain regions.

* * * * *